US012660669B2

(12) United States Patent
Chen et al.

(10) Patent No.: US 12,660,669 B2
(45) Date of Patent: Jun. 16, 2026

(54) SEMICONDUCTOR DEVICE AND METHOD OF MANUFACTURING THE SAME

(71) Applicant: Advanced Semiconductor Engineering, Inc., Kaohsiung (TW)

(72) Inventors: Jhao-Cheng Chen, Kaohsiung (TW); Huang-Hsien Chang, Kaohsiung (TW); Wen-Long Lu, Kaohsiung (TW); Shao Hsuan Chuang, Kaohsiung (TW); Ching-Ju Chen, Kaohsiung (TW); Tse-Chuan Chou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 17/958,237

(22) Filed: Sep. 30, 2022

(65) Prior Publication Data

US 2023/0027674 A1     Jan. 26, 2023

Related U.S. Application Data

(63) Continuation of application No. 16/825,713, filed on Mar. 20, 2020, now Pat. No. 11,495,557.

(51) Int. Cl.
*H10W 72/20*          (2026.01)
*H10W 72/00*          (2026.01)
(Continued)

(52) U.S. Cl.
CPC ......... *H10W 72/20* (2026.01); *H10W 72/012* (2026.01); *H10W 72/01961* (2026.01);
(Continued)

(58) Field of Classification Search
CPC ........... H01L 23/5226; H01L 23/49811; H01L 23/48; H01L 24/06; H01L 24/05; H01L 24/03
(Continued)

(56) References Cited

U.S. PATENT DOCUMENTS

| | | | | |
|---|---|---|---|---|
| 4,919,778 A | * | 4/1990 | Dietrich | ................ C03C 17/366 |
| | | | | 204/192.15 |
| 7,989,356 B2 | * | 8/2011 | Bao | ......................... H01L 24/05 |
| | | | | 257/E23.06 |

(Continued)

FOREIGN PATENT DOCUMENTS

| | | |
|---|---|---|
| CN | 103028861 A | 4/2013 |
| JP | 2000-150742 A | 5/2000 |
| JP | 2002-237497 A | 8/2002 |

OTHER PUBLICATIONS

Non-Final Office Action for U.S. Appl. No. 16/825,713, issued on Mar. 14, 2022, 15 pages.

(Continued)

*Primary Examiner* — Michael G Lee
(74) *Attorney, Agent, or Firm* — Foley and Lardner LLP

(57)          ABSTRACT

A semiconductor device and method for manufacturing the same are provided. The method includes providing a first substrate. The method also includes forming a first metal layer on the first substrate. The first metal layer includes a first metal material. The method further includes treating a first surface of the first metal layer with a solution including an ion of a second metal material. In addition, the method includes forming a plurality of metal particles including the second metal material on a portion of the first surface of the first metal layer.

9 Claims, 11 Drawing Sheets

(51) Int. Cl.
 *H10W 72/90* (2026.01)
 *H10W 80/00* (2026.01)
(52) U.S. Cl.
 CPC .......... *H10W 72/90* (2026.01); *H10W 72/931*
 (2026.01); *H10W 80/016* (2026.01)
(58) Field of Classification Search
 USPC ......................................................... 257/773
 See application file for complete search history.

(56) References Cited

U.S. PATENT DOCUMENTS

| | | |
|---|---|---|
| 9,478,518 B2 | 10/2016 | Dragoi et al. |
| 2001/0023779 A1 | 9/2001 | Sugaya et al. |
| 2001/0038151 A1 | 11/2001 | Takahashi et al. |
| 2005/0224976 A1* | 10/2005 | Hsu ......................... H01L 24/11 |
| | | 257/E21.509 |
| 2010/0084765 A1* | 4/2010 | Lee ......................... H01L 24/13 |
| | | 257/738 |
| 2012/0211889 A1* | 8/2012 | Edwards ............... H01L 21/568 |
| | | 257/746 |
| 2013/0087605 A1 | 4/2013 | Kubota et al. |
| 2013/0223034 A1* | 8/2013 | Rathburn ................. H05K 1/18 |
| | | 361/767 |
| 2014/0191390 A1* | 7/2014 | Chuang ............... H01L 23/3192 |
| | | 257/737 |
| 2016/0190420 A1* | 6/2016 | Miller ................. H10N 10/852 |
| | | 136/238 |
| 2017/0025381 A1* | 1/2017 | Tsai ................. H01L 21/76877 |

OTHER PUBLICATIONS

Notice of Allowance for U.S. Appl. No. 16/825,713, issued Jul. 1, 2022, 8 pages.
Office Action for corresponding Chinese Patent Application No. 202010447298.6, issued Nov. 6, 2024, 6 pages.
Search Report with English translation for corresponding Chinese Patent Application No. 202010447298.6, issued Nov. 6, 2024, 5 pages.

\* cited by examiner

SEMICONDUCTOR DEVICE AND METHOD OF MANUFACTURING THE SAME

CROSS-REFERENCE TO RELATED APPLICATION

This application is a continuation of U.S. patent application Ser. No. 16/825,713 filed Mar. 20, 2020, the contents of which is incorporated herein by reference in its entirety.

BACKGROUND

1. Field of the Disclosure

The present disclosure relates to a semiconductor device and a method of manufacturing the same.

2. Description of Related Art

Copper to copper bonding is one step in the manufacture of a semiconductor device. copper to copper bonding is normally implemented by an annealing process. However, conventional annealing process is performed at a temperature more than 250° C., resulting in damage on the semiconductor device, the wafer or other electronic components. Therefore, a new method is required to increase the yield of manufacturing the semiconductor device.

SUMMARY

According to some embodiments of the present disclosure, a method for manufacturing a semiconductor device includes providing a first substrate. The method also includes forming a first metal layer on the first substrate. The first metal layer includes a first metal material. The method further includes treating a first surface of the first metal layer with a solution including an ion of a second metal material. In addition, the method includes forming a plurality of metal particles including the second metal material on a portion of the first surface of the first metal layer.

According to some embodiments of the present disclosure, a semiconductor device includes a substrate and a conductive element. The conductive element is disposed on the substrate. The conductive element includes a first metal layer, a second metal layer and an alloy layer. The first metal layer includes a first metal material. The second metal layer includes a second metal material. The alloy layer includes the first metal material and the second metal material, and is disposed between the first metal layer and the second metal layer. The first metal layer and the second metal layer are arranged alternatively along a direction.

According to some embodiments of the present disclosure, a semiconductor device includes a substrate and a conductive element. The conductive element is disposed on the substrate. The conductive element has a lateral surface. The conductive element includes a first metal layer, a plurality of metal particles and a plurality of alloy shells. The first metal layer includes a first metal material. The plurality of metal particles include a second metal material. At least one of the plurality of metal particles is embedded in the first metal layer. At least one of the plurality of metal particles has a portion protruding from the lateral surface of the first metal layer. The plurality of alloy shells includes the first metal material and the second metal material. Each of the plurality of alloy shells covers the corresponding metal particle.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
FIG. 1 is a cross-sectional view of a semiconductor device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device 1a in accordance with some embodiments of the present disclosure. In some embodiments, the semiconductor device 1a includes a substrate 10, a substrate 20 and a conductive element 30.

The substrate 10 may include a printed circuit board (PCB), wafer, redistribution layer (RDL), package substrate, interposer or other substrate. The PCB may include a paper-based copper foil laminate, a composite copper foil laminate, or a polymer-impregnated glass-fiber-based copper foil laminate. In some embodiments, the substrate 10 may also include a lead frame. In some embodiments, the substrate 10 may include wafer die, such as silicon wafer die, Fanout wafer die, glass wafer die or a combination thereof.

The substrate 20 faces the substrate 10. The substrate 20 may include a printed circuit board (PCB), wafer, redistribution layer (RDL), package substrate, interposer or other substrate. The PCB may include a paper-based copper foil laminate, a composite copper foil laminate, or a polymer-impregnated glass-fiber-based copper foil laminate. In some embodiments, the substrate 20 may also include a lead frame. In some embodiments, the substrate 20 may include wafer die, such as silicon wafer die, Fanout wafer die, glass wafer die or a combination thereof.

The conductive element 30 is disposed on the substrate 10. The conductive element 30 is disposed between the substrates 10 and 20. The conductive element 30 is configured to serve as, for example, an electrode, a conductive pad, a dummy pad, a conductive pillar, a dummy pillar or a combination thereof, and the present disclosure is not limited thereto. In some embodiments, the conductive element 30 includes a metal layer 31, a metal layer 32 and an interface layer 33.

The metal layer 31 is disposed on the substrate 10. The metal layer 31 includes at least a first metal material. The first metal material may include copper (Cu), aluminum (Al), iron (Fe), zinc (Zn), nickel (Ni), tin (Sn), lead (Pb), silver (Ag), mercury (Hg), gold (Au) or a combination thereof. In some exemplary embodiments, copper is selected as an example of the first metal material.

The metal layer 32 is disposed on the substrate 20. In some embodiments, the metal layer 32 includes at least the first metal material. In some embodiments, the material of the metal layer 32 is the same as that of the metal layer 31.

In some embodiments, the interface layer 33 is disposed on the metal layer 31. In some embodiments, the interface layer 33 is disposed between the metal layers 31 and 32. Details of the interface layer 33 are disclosed in the following paragraphs in accompany with FIG. 2A and FIG. 2B.

In some embodiments, the semiconductor device 1a further includes a passivation layer 60. The passivation layer 60 is disposed between the substrate 10 and the substrate 20. The passivation layer 60 may surround the conductive element 30. The passivation layer 60 may be configured to protect the conductive element 30 from damage or contamination. The passivation layer 60 may include inorganic dielectric material such as silicon nitride, silicon oxide, or silicon oxynitride, organic dielectric material such as polyimide (PI), Polybenzoxazole (PBO), or Benzocyclobutene (BCB), or other suitable materials.

Figures 2A, 2B:
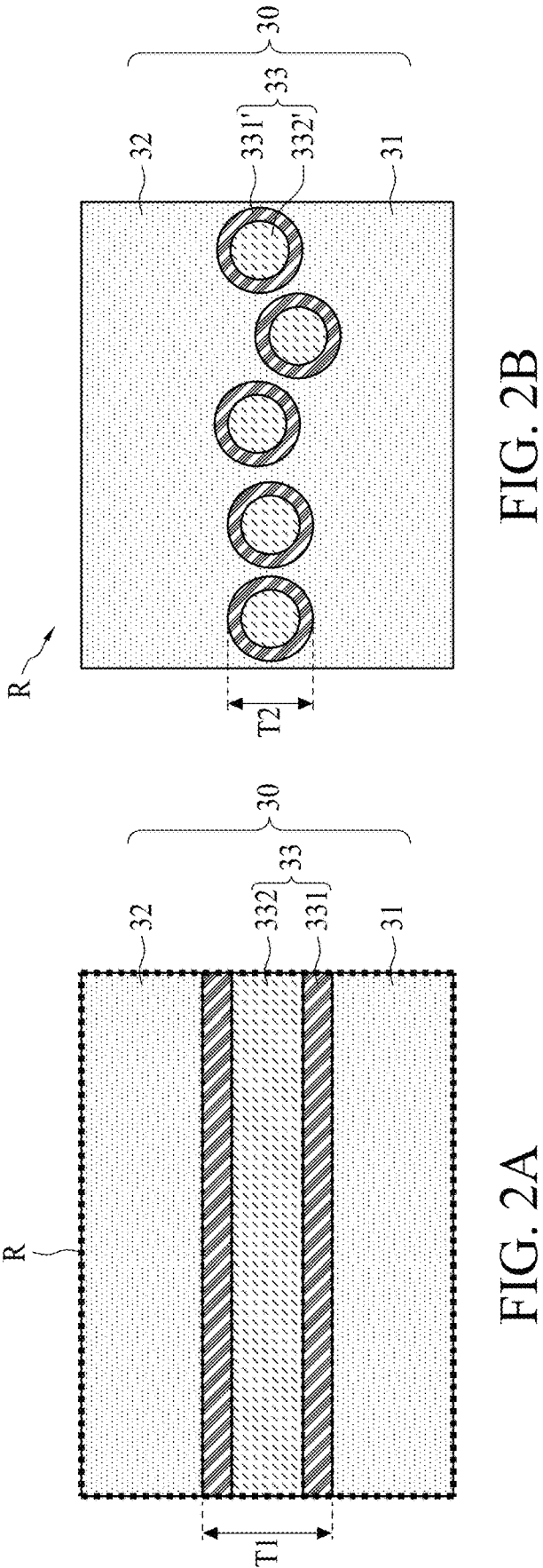
FIG. 2A is a partial enlarged view of the semiconductor device shown in FIG. 1.
FIG. 2B, FIG. 2C and FIG. 2D are cross-sectional views of a conductive element in accordance with some embodiments of the present disclosure.

FIG. 2A is an enlarged view of region R in the semiconductor device 1a shown in FIG. 1 in accordance with some embodiments of the present disclosure. In some embodiments, the interface layer 33 includes an alloy layer 331 and a metal layer 332. The metal layer 332 includes at least a second metal material different from the first metal material. In some embodiments, the reduction potential of the second metal material is greater than or exceeds that of the first metal material. In some embodiments, the reduction potential of the ion of the second metal material is greater than or exceeds that of the first metal material. In some embodiments, the second metal material includes copper, aluminum, iron, nickel, tin, lead, silver, mercury, gold, platinum or a combination thereof. In some exemplary embodiments, copper is used as an example of the first metal material, and silver is used as an example of the second metal material.

The alloy layer 331 is disposed between the metal layer 31 and the metal layer 332. The alloy layer 331 is an alloy of the first metal material and the second metal material such as copper-sliver alloy.

In some embodiments, the thickness T1 of the sum of the alloy layer 331 and the metal layer 332 is in a range from about 30 nm to about 50 nm. In some embodiments, the thickness T1 is in a range from about 50 nm to about 100 nm. In some embodiments, the thickness T1 is in a range from about 100 nm to about 200 nm. In some embodiments, the thickness T1 is in a range from about 200 nm to about 400 nm.

FIG. 2B is an enlarged view of region R in the semiconductor device 1a shown in FIG. 1 in accordance with other embodiments of the present disclosure.

As shown in FIG. 2B, the interface layer 33 may include a plurality of metal particles 332' and alloy shells 331'. Each of the metal particles 332' is separated from each other. Each of the alloy shells 331' covers or seals the corresponding metal particle 332'. In some embodiments, the metal particles 332' may be arranged along a direction that is across from one lateral surface of the conductive element 30 to the other lateral surface of the conductive element 30. In some embodiments, the metal particles 332' and the first metal layer 31 may be alternatively arranged along the direction across from one lateral surface of the conductive element 30 to the other lateral surface of the conductive element 30. In some embodiments, each of the metal particles 332' is embedded in the metal layer 31 or in the metal layer 32. In some embodiments, each of the alloy shells 331' is embedded in the metal layer 31 or in the metal layer 32.

The profile of the metal particle 332' may be circular, oval, or irregularly shaped. In some embodiments, the alloy shells 331' cover or seal the metal particle 332'. The metal particle 332' is separated from the metal layer 31 by the alloy shells 331'. In some embodiments, the alloy shells 331' may conformally cover the metal particle 332'.

In some embodiments, the diameter T2 of the sum of the metal particle 332' and the corresponding alloy shells 331' is in a range from about 10 nm to about 50 nm. In some embodiments, the thickness T2 is in a range from about 50 nm to about 100 nm. In some embodiments, the thickness T2 is in a range from about 100 nm to about 500 nm.

In some embodiments, the diameter of the metal particle 332' is in a range from about 10 nm to about 50 nm. In some embodiments, the diameter of the metal particle 332' is in a range from about 50 nm to about 100 nm.

In some embodiments, the amount of the first metal material (e.g., copper) in the alloy layer 331 or in the alloy shell 331' is in a range from about 20 weight % to about 40 weight %. In some embodiments, the amount of copper in the alloy layer 331 or in the alloy shell 331' is in a range from about 40 weight % to about 70 weight %. In some embodiments, the amount of copper in the alloy layer 331 or in the alloy shell 331' is in a range from about 70 weight % to about 90 weight %.

In some embodiments, the amount of the second metal material (e.g., silver) in the alloy layer 331 or in the alloy shell 331' is in a range from about 5 weight % to about 20 weight %. In some embodiments, the amount of silver in the alloy layer 331 or in the alloy shell 331' is in a range from about 20 weight % to about 50 weight %. In some embodiments, the amount of silver in the alloy layer 331 or in the alloy shell 331' is in a range from about 50 weight % to about 80 weight %.

5

In some embodiments, there is no boundary between the metal layer 31 and metal layer 32, and the metal layer 31 and metal layer 32 may be regarded as a single metal layer that includes the first metal material.

The alloy layer 331 or alloy shell 331' may further include additional elements such as carbon (C), oxygen (O) or other elements. In some embodiments, the amount of the additional elements is in a range from about 0 to about 10 weight %.

Figure 2D:
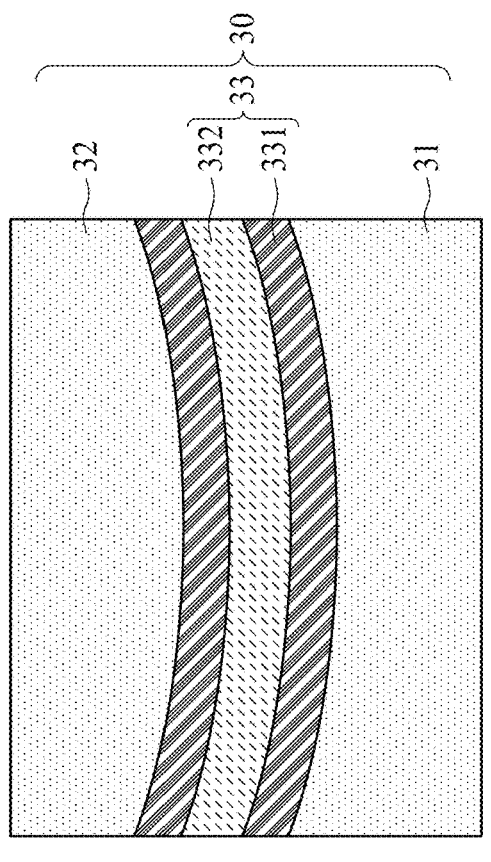
Figure 2C:
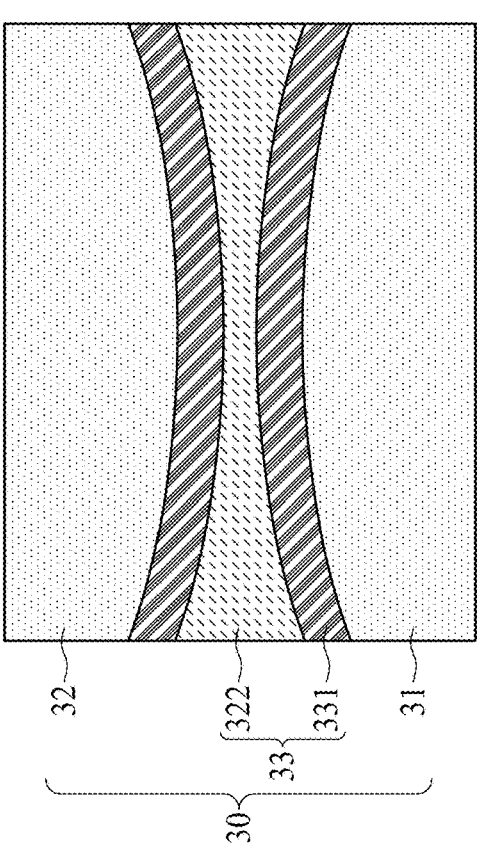

Referring to FIG. 2C, the metal layer 332 may be thinner at the central portion, and thicker at two sides of the conductive element 30. The alloy layer 331 may be conformally formed on the alloy layer 331.

Referring to FIG. 2D, the metal layer 332 may have substantially the same thickness from one lateral surface of the conductive element 30 to the other surface of the conductive element 30, and may be concave or convex. In some embodiments, the alloy layer 331 may be concave or convex corresponding to that of the metal layer 332.

Figure 3:
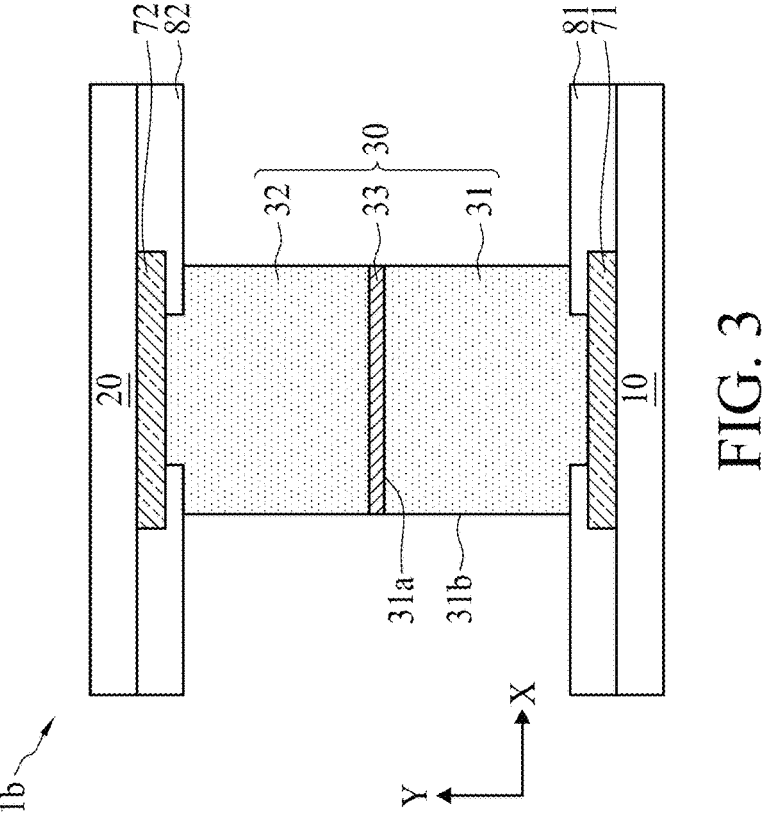

FIG. 3 is a cross-sectional view of a semiconductor device 1b in accordance with some embodiments of the present disclosure. The semiconductor device 1b may include a pad 71. The pad 71 may be disposed on the substrate 10. The pad 71 may include conductive material, such as metal or alloy. The semiconductor device 1b may include a passivation layer 81. The passivation layer 81 may be disposed on the substrate 10 covering a portion of the pad 71. The passivation layer 81 may include nitride, oxide, oxynitride or other suitable materials.

The semiconductor device 1b may include a pad 72. The pad 72 may be disposed on the substrate 20. The pad 72 may be disposed on the substrate 20. The pad 72 may include conductive material, such as metal or alloy. The semiconductor device 1b may include a passivation layer 82. The passivation layer 82 may be disposed on the substrate 20 and cover a portion of the pad 72. The passivation layer 82 may include nitride, oxide, oxynitride or other suitable materials.

The conductive element 30 is electrically connected to the pad 71. The conductive element 30 is electrically connected to the pad 72. The metal layer 31 may have lateral surfaces 31b that are exposed. In this embodiment, the interface layer 33 may be disposed on the upper surface 31a of the metal layer 31. The interface layer 33 may extend along a first direction that is parallel to the X-axis. The interface layer 33 may extend across the conductive element 30 from one lateral surface to the other lateral surface of the conductive element 30 along the first direction. In some embodiments, the upper surface 31a may be perpendicular to the lateral surface 31b. In some embodiments, the upper surface 31a may be inclined relative to the lateral surface 31b.

Although FIG. 3 illustrates the interface layer 33 as a single continuous layer extending along the first direction, the interface layer 33 may include, for example, a plurality of metal particles 332' and alloy shells 331' as shown in FIG. 2B in accordance with some embodiments. The metal particles 332' of the interface layer 33 are arranged along the X-axis. The metal particles 332' may be disposed on the upper surface 31a of the metal layer 31. The interface layer 33 may also include metal layer 332 and alloy layer 331 as shown in FIG. 2A, FIG. 2C and FIG. 2D in accordance with some embodiments.

Figure 4:
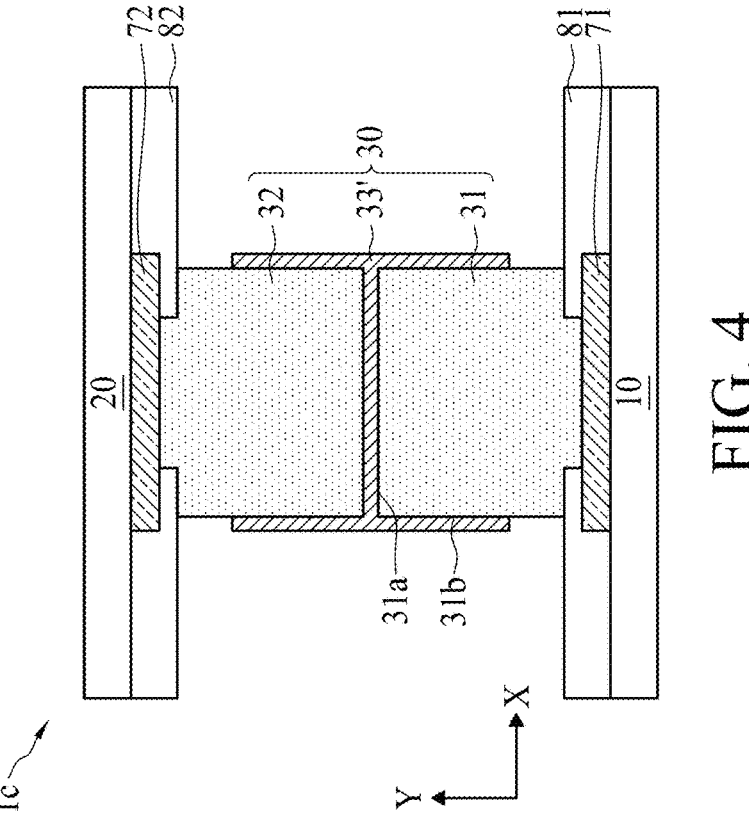
FIG. 3, FIG. 4, FIG. 5, FIG. 6 and FIG. 7 are cross-sectional views of a semiconductor device in accordance with some embodiments of the present disclosure.

FIG. 4 is a cross-sectional view of a semiconductor device 1c in accordance with some embodiments of the present disclosure. The semiconductor device 1c of FIG. 4 has a structure similar to that of the semiconductor device 1b of FIG. 3 except that the interface layer 33' of the semiconductor device 1c may be further disposed on the lateral surface of the conductive element 30.

In some embodiments, the interface layer 33' may be further disposed on the lateral surface 31b of the metal layer 31 along a second direction parallel to the Y-axis.

Although FIG. 4 illustrates the interface layer 33' is a single continuous layer, the interface layer 33' may include, for example, a plurality of metal particles 332' and alloy shells 331' shown in FIG. 2B in accordance with some embodiments. In some embodiments, the metal particle 332' of the interface layer 33', disposed on the lateral surface 31b, may have a portion protruding from the lateral surface 31b. In some embodiments, the alloy shell 331' of the interface layer 33' disposed on the lateral surface 31b may have a portion protruding from the lateral surface 31b.

Figure 5:
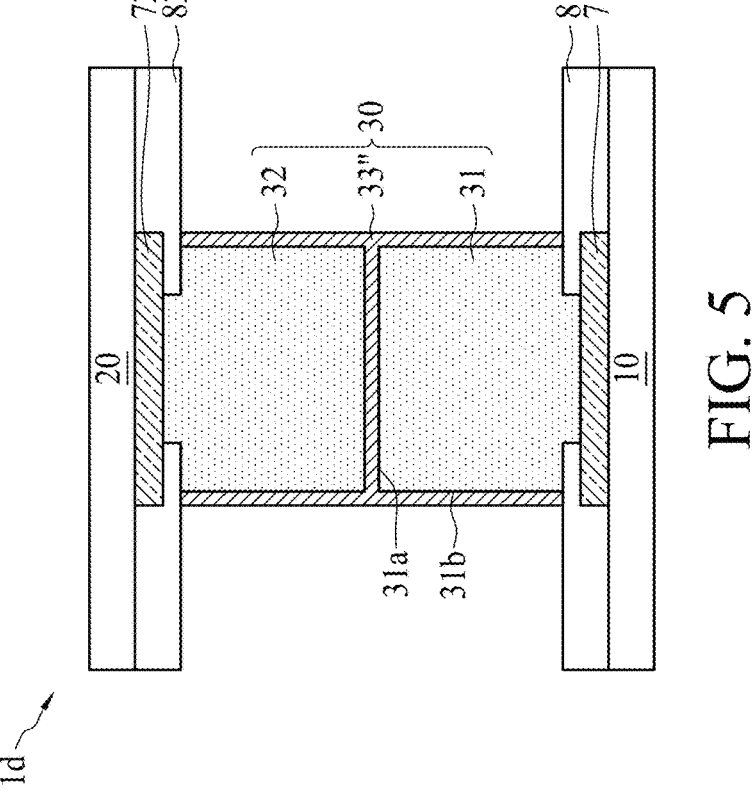

FIG. 5 is a cross-sectional view of a semiconductor device 1d in accordance with some embodiments of the present disclosure. The semiconductor device 1d of FIG. 5 has a structure similar to that of the semiconductor device 1c of FIG. 4 except that the interface layer 33" of the semiconductor device 1d may extend from the passivation layer 81 to the passivation layer 82.

Figure 6:
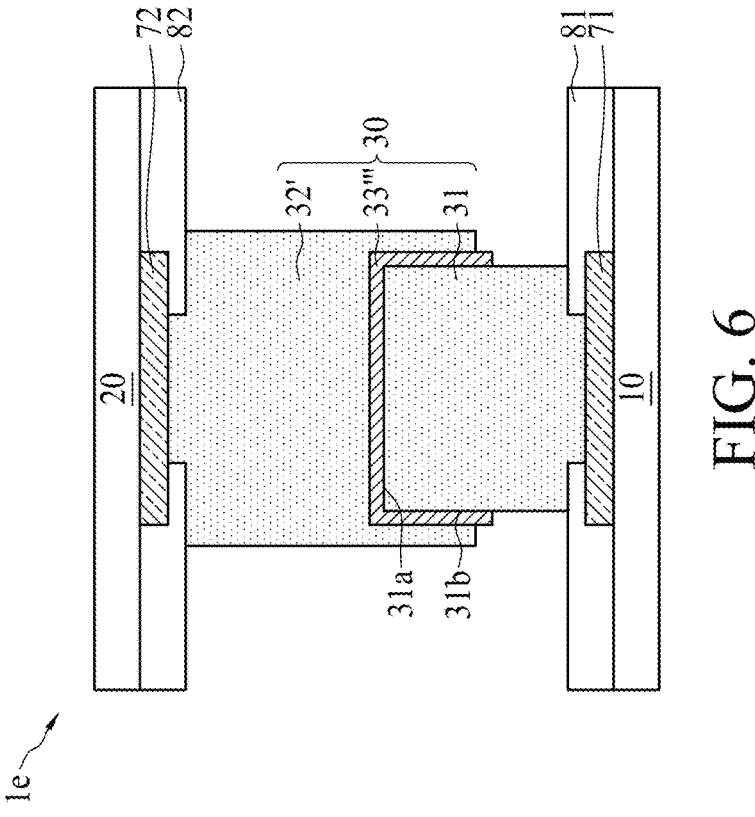

FIG. 6 is a cross-sectional view of a semiconductor device 1e in accordance with some embodiments of the present disclosure. The semiconductor device 1e of FIG. 6 has a structure similar to that of the semiconductor device 1c of FIG. 4 except that the metal layer 32' of the semiconductor device 1e may have a concavity accommodating the first metal layer 31. In some embodiments, the concavity of the metal layer 32' may correspond to the upper surface 31a and the lateral surface 31b of the metal layer 31. In some embodiments, the metal layer 32' has a profile different from that of the metal layer 31. In some embodiments, the interface layer 33''' of the semiconductor device 1e may be disposed on the upper surface 31a and the lateral surface 31b of the metal layer 31. A portion of the interface layer 33''' is exposed from the metal layer 32'. In this embodiment, the interface layer 33''' may be U-shaped. In this embodiment, the arrangement of the metal particles 331' may be U-shaped.

Figure 7:
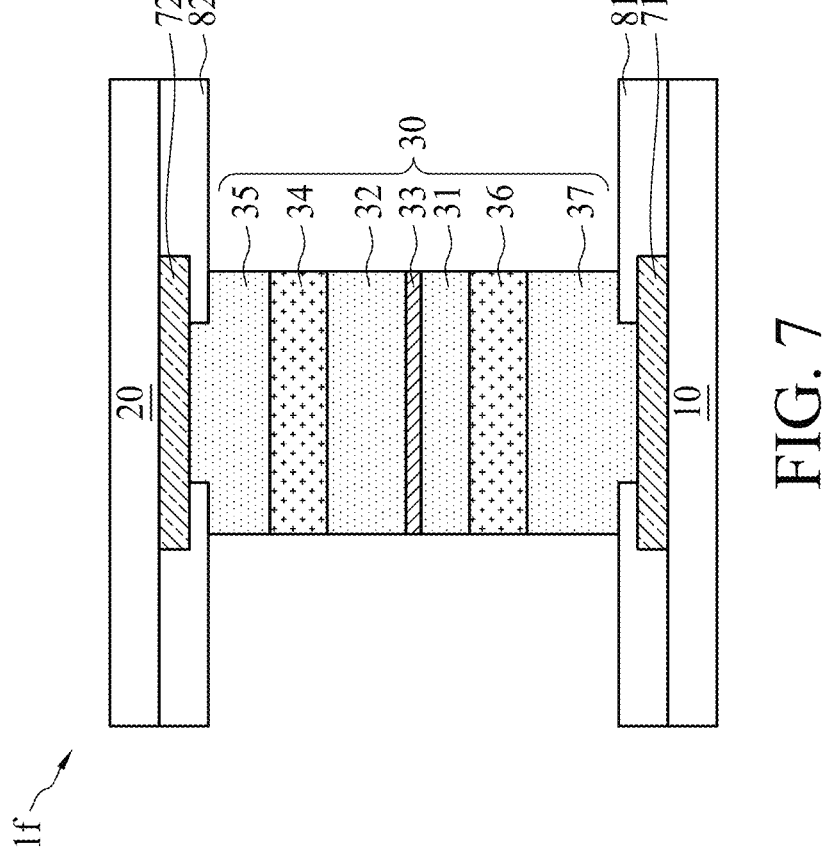

FIG. 7 is a cross-sectional view of a semiconductor device if in accordance with some embodiments of the present disclosure. The semiconductor device if of FIG. 7 has a structure similar to that of the semiconductor device 1b of FIG. 3 except that the semiconductor device if may further include a barrier layer 34, a metal layer 35, a barrier layer 36 and a metal layer 37.

The metal layer 35 may be in direct contact with the pad 72. The metal layer 37 may be in direct contact with the pad 71. The barrier layer 34 may be disposed between the metal layer 32 and the metal layer 35. The barrier layer 36 may be disposed between the metal layer 31 and the metal layer 37. The materials of the metal layer 37 may include a third metal material that is different from the first metal material. The third metal material includes copper, aluminum, iron, nickel, tin, lead, silver, gold or other suitable materials. The material of the metal layer 35 may be the same as that of the metal layer 37.

The barrier layer 36 may be configured to prevent the second metal material in the interface layer 33 from diffusing into the metal layer 37 during the formation of the conductive element 30. The materials of the barrier layer 36 may include titanium, tantalum. For example, the barrier layer 36 may be made of titanium nitride or other suitable materials. The material of the barrier layer 34 may be the same as that of the barrier layer 36.

FIG. 8A, FIG. 8B, FIG. 8C, FIG. 8D and FIG. 8E illustrate various stages of a method for manufacturing the semiconductor device 1a in accordance with some embodiments of the present disclosure.

Figures 8A, 8B:
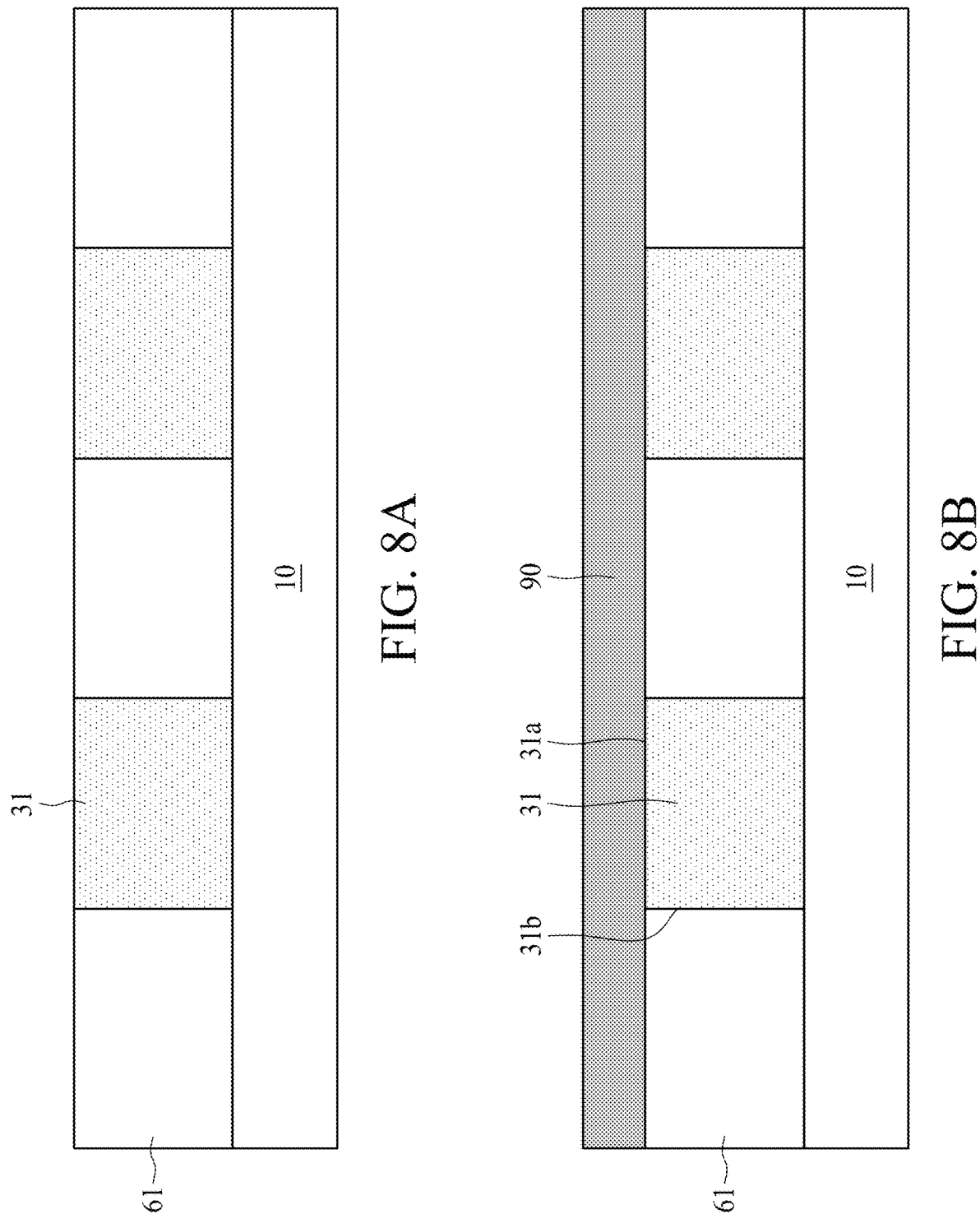
FIG. 8A, FIG. 8B, FIG. 8C, FIG. 8D and FIG. 8E illustrate various stages of a method for manufacturing a semiconductor device in accordance with some embodiments of the present disclosure.

Referring to FIG. 8A, a substrate 10 is provided. A passivation layer 61 is formed on the substrate 10. The passivation layer 61 may include nitride, oxide, oxynitride or other suitable materials. In some embodiments, the passivation layer 61 may be deposited on the upper surface of the substrate 10, and then a patterning process may be performed on the passivation layer 61 to form a plurality of openings.

The metal layer 31, including or made of the first metal material, may be formed in the openings of the passivation layer 61. The metal layer 31 may be formed by, for example, a sputter process, an electroplating process or other suitable process.

Referring to FIG. 8B, the substrate 10 may be soaked in a solution 90. In some embodiments, the solution 90, including the ions of the second metal material, may be sprayed or coated on an upper surface 31a of the metal layer 31 and on an upper surface of the passivation layer 61. In some embodiments, the solution 90 may be a silver nitrite (AgNO₃) solution, which includes a plurality of silver ions dispersed in a nitrite solution. In some embodiments, when the passivation layer 61 is not formed, the solution 90 may be further coated on the lateral surface 31b of the metal layer 31.

In some embodiments, a pretreatment may be performed on the upper surface 31a of the metal layer 31 and on the upper surface of the passivation layer 61. The pretreatment may be used to remove native oxide formed on the upper surface 31a. The pretreatment may include, for example, a clean process or other suitable processes.

In some embodiments, the solution 90 may include AuCN, AgCN, CuSO₄, NiSO₄, ZnSO₄, other suitable salt or materials. In some embodiments, the concentration of the solution 90 may be in a range from about 0.001 M to about 0.1 M. In some embodiments, the concentration of the solution 90 may be in a range from about 0.01 M to about 0.05 M.

Figure 8C:
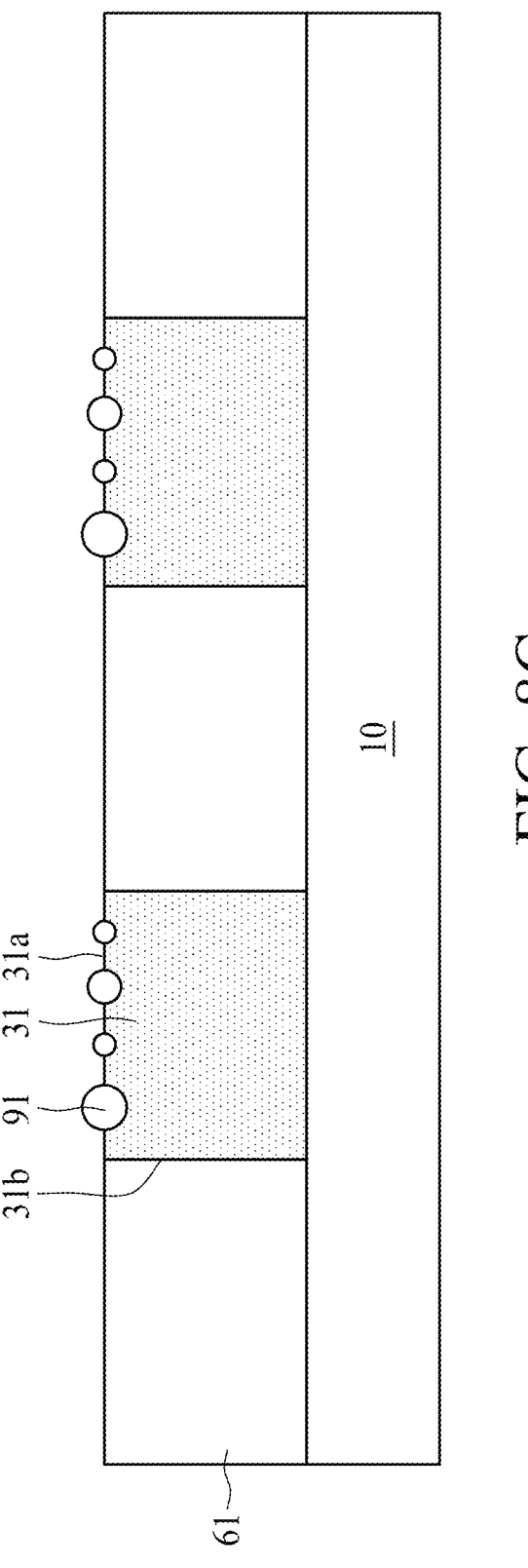

Referring to FIG. 8C, a plurality of metal particles 91, including or made of the second metal material, may be formed on the upper surface 31a of the metal layer 31. In some embodiments, the metal particle 91 may include silver. When the reduction potential of the ion of the second metal material is greater than or exceeds that of the first metal material, a Galvanic displacement reaction will occur. The Galvanic displacement reaction oxidizes the first metal material to an ion of the first metal material, and reduces the ion of the second metal material to second metal material. As a result, the metal particle 91 may be formed on the upper surface 31a of the metal layer 31. For example, when the silver nitrate solution is coated on the copper, silver ions are reduced to form silver nano particles, and copper is oxidized to form copper ions. The reaction may be presented as follows:

$$2AgNO_{3(aq)} + Cu_{(s)} \rightarrow 2Ag_{(s)} + Cu(NO_3)_{2(aq)}$$

Galvanic displacement reaction may occur at specific temperatures. For example, copper may be replaced with silver at a temperature between about 25° C. to about 100° C. In some embodiments, the size of each of the plurality of metal particles 91 is in a range from about 20 nm to about 35 nm. In some embodiments, the size of each of the plurality of metal particles 91 is in a range from about 35 nm to about 50 nm. In some embodiments, the size of each of the plurality of metal particles 91 is in a range from about 50 nm to about 70 nm. In some embodiments, the size of each of the plurality of metal particles 91 is in a range from about 70 nm to about 90 nm. When the size of metal particles 91 is in this range, the interface layer 33 will form at a lower temperature.

In some embodiments, when the passivation layer 61 is not present, the metal particles 91, such as silver particles, may be further formed on the lateral surface 31b of the metal layer 31. In some embodiments, the roughness of the upper surface of the metal layer 31 is in a range from about 1 nm to about 10 nm. In some embodiments, the roughness of the upper surface of the metal layer 31 is in a range from about 10 nm to about 50 nm.

Figure 8D:
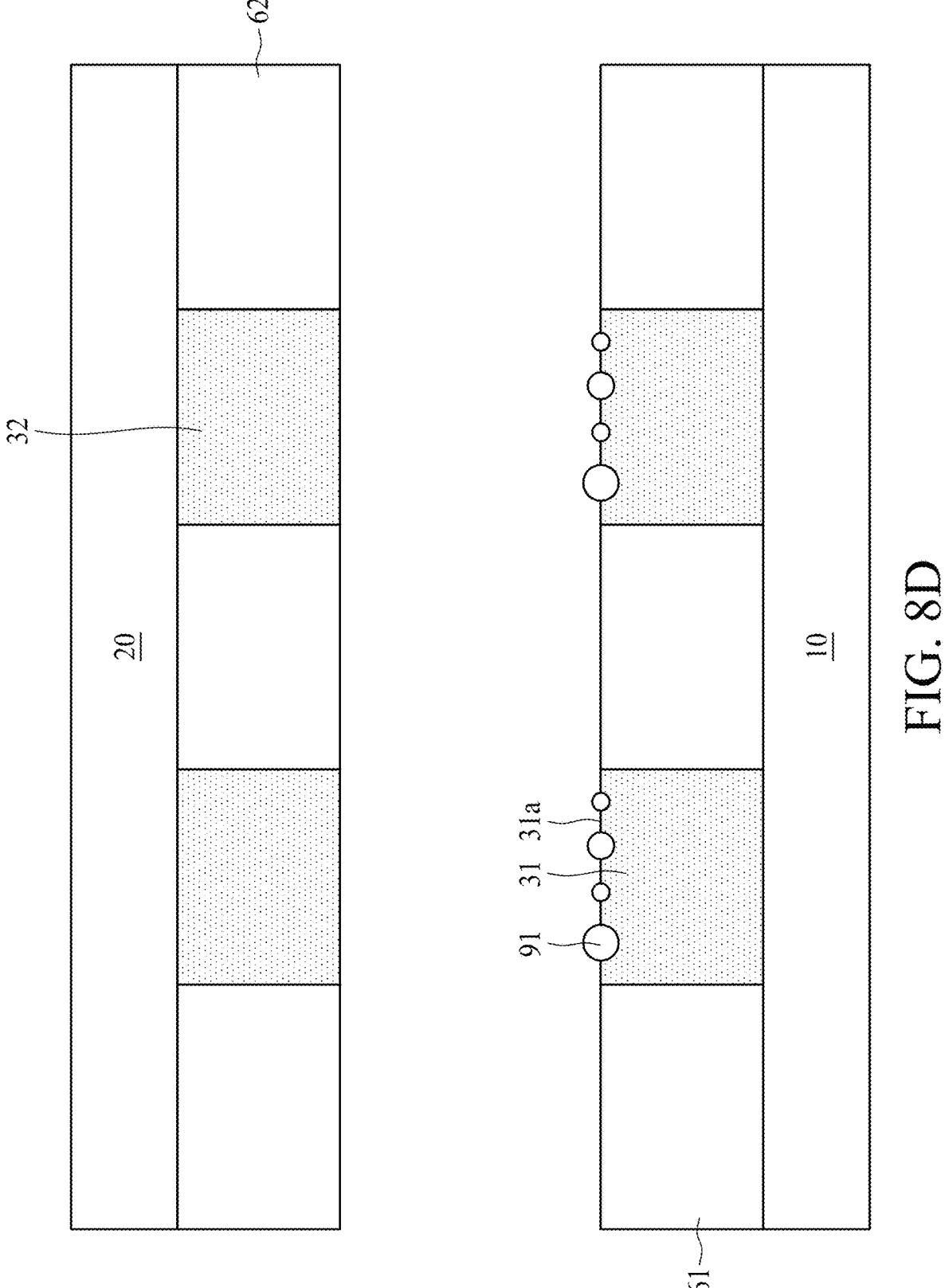

Referring to FIG. 8D, a substrate 20 is provided. A metal layer 32 and a passivation layer 62 may be formed on the substrate 20. The processes for forming the metal layer 32 and the passivation layer 62 may be similar to or the same as those of the metal layer 31 and the passivation layer 61, and are not repeated herein. In some embodiments, the metal particles 91 may be formed on the surface of the metal layer 32.

Figure 8E:
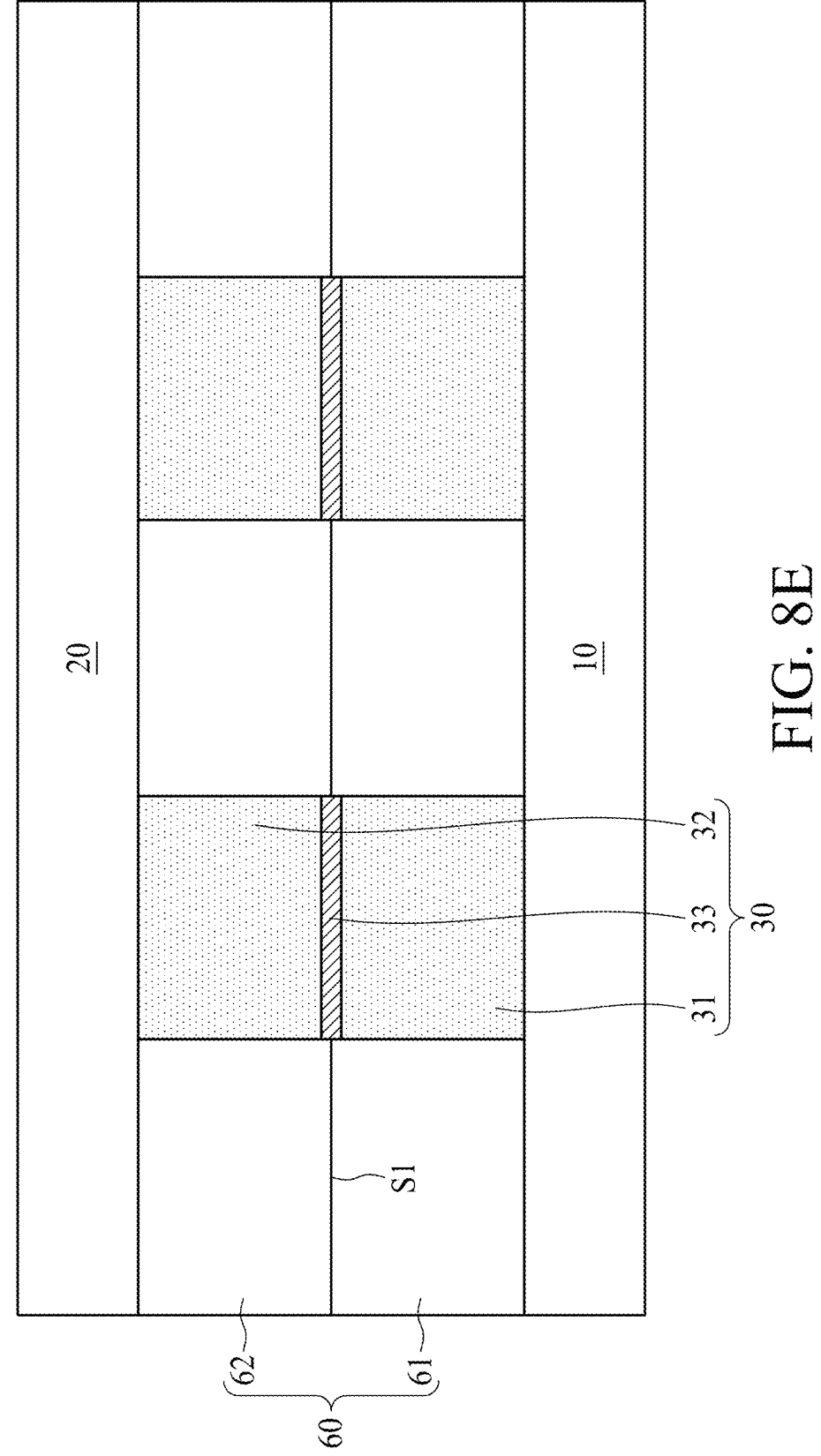

Referring to FIG. 8E, metal to metal bonding, such as the metal layer 31 to the metal layer 32, is formed, and the semiconductor device 1a is produced. The metal layer 31 and the metal layer 32 may be bonded by a heating process, which may be performed at, for example, below 200° C. When the heating process is performed, an interface layer 33 is formed. In some embodiments, the passivation layer 61 is bonded with the passivation layer 62 to form the passivation layer 60.

In addition, the passivation layer 61 is bonded to the passivation layer 62, and a boundary S1 is formed. In this step, a hybrid bonding is completed during the step from FIG. 8D to FIG. 8E. The hybrid bonding includes two different types of bonding. More specifically, the step from FIG. 8D to FIG. 8E includes forming a bonding between metal layers and forming a bonding between passivation layers. The metal particles 91 can be selectively formed on the metal layer 31, and thus can enhance the bonding of the metal layer 31 and the metal layer 32 without adversely affecting the bonding of the passivation layer 61 and the passivation layer 62.

In some embodiments, the first metal material is copper, and the second metal material is silver. In this embodiment, copper and silver can form alloy, which inhibits or prevents from formation of intermetallic compound (IMC). Therefore, resistance of the conductive element 30 is reduced. Moreover, the process for forming the metal to metal bonding, such as the bonding between the metal layer 31 to the metal layer 32, may be performed at a lower temperature and/or a less time.

In this embodiment, the metal particles 91 are formed on the metal layer by Galvanic displacement reaction, which can omit a plasma treatment before the metal layer 31 is bonded to metal layer 32. The plasma treatment may damage the surface of the passivation layer 61, causing the bonding between the passivation layers 61 and 62 to be more difficult. In this embodiment, the upper surface of the passivation layer 61 is not damaged by the plasma process, so the bonding of the passivation layers 61 and 62 is stronger. In comparison with process with a plasma treating a metal layer and a passivation layer, the embodiments of the present disclosure, using Galvanic displacement reaction, can form a stronger hybrid bonding. In a comparison example without formation of metal particles 91, a plasma process is performed on a surface of a copper pad to generate voids thereon in order to accelerate the diffusion rate of copper atoms in the subsequent annealing, and then an anneal process is performed for copper to copper bonding process. However, the plasma process does not have selectivity to materials and the surface of a passivation layer is also bombarded by the plasma, which makes passivation layer to passivation layer bonding more difficult. In some embodiments of the present disclosure, Galvanic displacement reaction has a selectivity to the metal layer 31 and the passivation layers 61 and 62. That is, the metal particles 91 are only formed on the interface of the metal layer 31 but not on the passivation layers 61 and 62, reducing contamination on the passivation layers 61 and 62. Therefore, passivation layer to passivation layer is much easier.

In addition, the metal particles 91 can assist in bonding two metal layers that have different shapes, such as shown in FIG. 6, enhancing the yield of the semiconductor device.

Figures 9A, 9B:
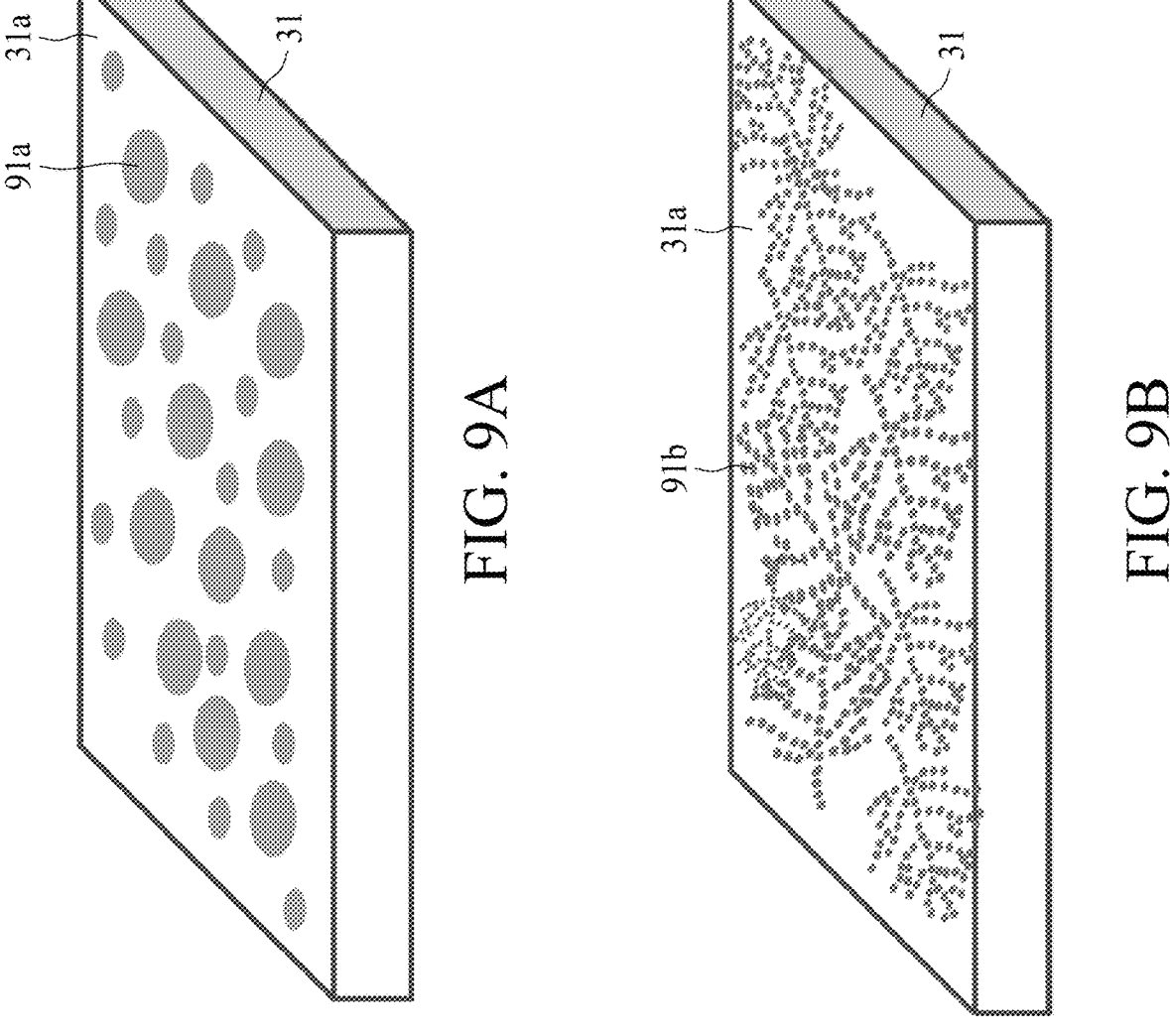
FIG. 9A and FIG. 9B illustrate a modified metal pad in accordance with some embodiments of the present disclosure.

FIG. 9A and FIG. 9B illustrate a modified metal pad in accordance with some embodiments of the present disclosure. The modified metal pad shown in FIG. 9A or FIG. 9B may be a structure shown in FIG. 8C, which includes the metal layer 31 and a plurality of metal particles 91 formed on the upper surface 31a of the metal layer 31.

As shown in FIG. 9A, the modified metal pad may include a plurality of metal particles 91a on the upper surface 31a of the metal layer 31. The plurality of metal particles 91a may be separated from each other. In some embodiments, the metal particles 91a may be randomly distributed on the upper surface 31a of the metal layer 31.

As shown in FIG. 9B, the modified metal pad may include a plurality of metal particles 91b on the upper surface 31a of the metal layer 31. The arrangement of the metal particles 91b on the upper surface 31a of the metal layer 31 may be a dendritic shape. The arrangement of the particles may be controlled by the process time, the process temperature and the concentration of the ions (e.g., Ag$^+$) in the solution 90. In this embodiment, the metal particles or alloy shells, formed after the bonding of the metal layer 31 to the metal layer 32, may be arranged in a dendritic shape.

The dendritic shape of the arrangement may assist in forming the metal particles 91b with a smaller size, reducing the process temperature during the bonding of the metal layer 31 and the metal layer 32.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a substrate having a top surface;
a conductive element disposed on the top surface of the substrate, and comprising:
a first metal layer having a first top side surface facing away from the top surface of the substrate, and a first lateral side surface connecting to the first top side surface; and
a second metal layer disposed over the first metal layer, directly contacting the first metal layer, and having a second top side surface facing away from the first top side surface of the first metal layer, and a second lateral side surface connecting to the second top side surface; and
a first monolithic passivation layer directly contacting the first lateral side surface of the first metal layer and the second lateral side surface of the second metal layer, wherein the first monolithic passivation layer has a top surface facing away from the top surface of the substrate, and a portion of the second metal layer extends beyond the top surface of the first monolithic passivation layer along a first direction substantially perpendicular to the top surface of the substrate, wherein the first monolithic passivation layer directly contacts a periphery edge of an interface between the first metal layer and the second metal layer.

2. The semiconductor device of claim 1, further comprising a third metal layer disposed over the second metal layer, wherein a third lateral side surface of the third metal layer is substantially aligned with the first lateral side surface of the first metal layer and the second lateral side surface of the second metal layer.

3. The semiconductor device of claim 2, further comprising a second monolithic passivation layer directly contacting the second lateral side surface of the second metal layer and the third lateral side surface of the third metal layer.

4. The semiconductor device of claim 2, wherein a thickness of the third metal layer is substantially equal to a thickness of the first metal layer, wherein the thickness of the third metal layer is greater than a thickness of the second metal layer.

5. The semiconductor device of claim 1, further comprising:

a second monolithic passivation layer directly contacting the top surface of the first monolithic passivation layer, wherein in a cross-sectional view, an interface between the second monolithic passivation layer and the first monolithic passivation layer is disposed between an elevation of the second top side surface of the second metal layer and an elevation of a second bottom side surface of the second metal layer facing away the first top side surface of the first metal layer.

6. The semiconductor device of claim 1, wherein the second metal layer includes a lower alloy layer, a middle metal layer and an upper alloy layer, wherein the middle metal layer is interposed between the lower alloy layer and the upper alloy layer, wherein the lower alloy layer is disposed between the first metal layer and the middle metal layer, wherein the lower alloy layer is an alloy of the first metal layer and the middle metal layer.

7. The semiconductor device of claim 6, wherein a thickness of the lower alloy layer is less than a thickness of the middle metal layer.

8. The semiconductor device of claim 1, wherein the second metal layer does not extend to the top surface of the first monolithic passivation layer.

9. The semiconductor device of claim 1, wherein the second metal layer does not overlap the first monolithic passivation layer in a direction substantially perpendicular to the top surface of the substrate.

* * * * *